United States Patent [19]

Oohata et al.

[11] Patent Number: 5,343,052
[45] Date of Patent: Aug. 30, 1994

[54] LATERAL INSULATED GATE BIPOLAR TRANSISTOR

[75] Inventors: Tosifumi Oohata; Mutsuhiro Mori; Naoki Sakurai, all of Hitachi, Japan

[73] Assignee: Hitachi, Ltd., Tokyo, Japan

[21] Appl. No.: 917,990

[22] Filed: Jul. 24, 1992

[30] Foreign Application Priority Data

Jul. 25, 1991 [JP] Japan .................................. 3-186106

[51] Int. Cl.$^5$ ..................... H01L 21/76; H01L 27/38; H01L 21/425
[52] U.S. Cl. .................................. 257/141; 257/139; 257/143; 257/144
[58] Field of Search ............... 257/139, 141, 143, 144, 257/37, 365, 401, 402, 529, 580, 581, 582, 925, 773, 775

[56] References Cited

U.S. PATENT DOCUMENTS

| | | |
|---|---|---|
| 4,717,679 | 1/1988 | Baliga et al. |
| 4,933,740 | 6/1990 | Baliga et al. ............... 357/38 |
| 5,100,814 | 3/1992 | Yamaguchi et al. ............... 257/256 |

FOREIGN PATENT DOCUMENTS

| | | |
|---|---|---|
| A0280535 | 2/1988 | European Pat. Off. |
| A0399530 | 5/1990 | European Pat. Off. |
| A2197987 | 11/1987 | United Kingdom |

OTHER PUBLICATIONS

Nonuniform and Latchup Current Detection in Lateral Conductivity Modulated FET's, K. O. Sin et al., 1990 IEEE.
W. T. Ng et al.: "P-Channel Schottky Injection Field Effect Transistors" Tech. Digest of the International Electron Devices Meeting, Dec. 1987.
J. Sin et al.: "Nonuniform and Latchup Current Detection in Lateral Conductivity Modulated FET's", IEEE Electron Device Letters, vol. 11, No. 6, Jun. 1990, pp. 250-252.

Primary Examiner—William L. Sikes
Assistant Examiner—Fetsum Abraham
Attorney, Agent, or Firm—Antonelli, Terry, Stout & Kraus

[57] ABSTRACT

A lateral insulated-gate bipolar transistor has a drift region having therein a base layer and a collector layer. An emitter layer is formed in the base layer. A gate electrode structure, comprising a control electrode and gate insulating layer, contacts the base layer, and also contacts the drift layer and the emitter layer. An emitter electrode contacts the emitter layer, and also the base layer, and a collector electrode contacts the collector layer. The emitter and collector electrodes are elongate and the ratio of their resistances per unit length is in the range of 0.5 to 2.0. This reduces the possibility of a localized high current density along the electrodes, thereby reducing the risk of latch-up due to parasitic thyristors. The collector and emitter electrodes may be of the same width and thickness, or of different widths and thicknesses, or may each have an auxiliary part (for example, in a multi-layer wiring arrangement), so that their resistances per unit length are in the desired range. A plurality of such transistors may be fabricated together in an array.

14 Claims, 6 Drawing Sheets

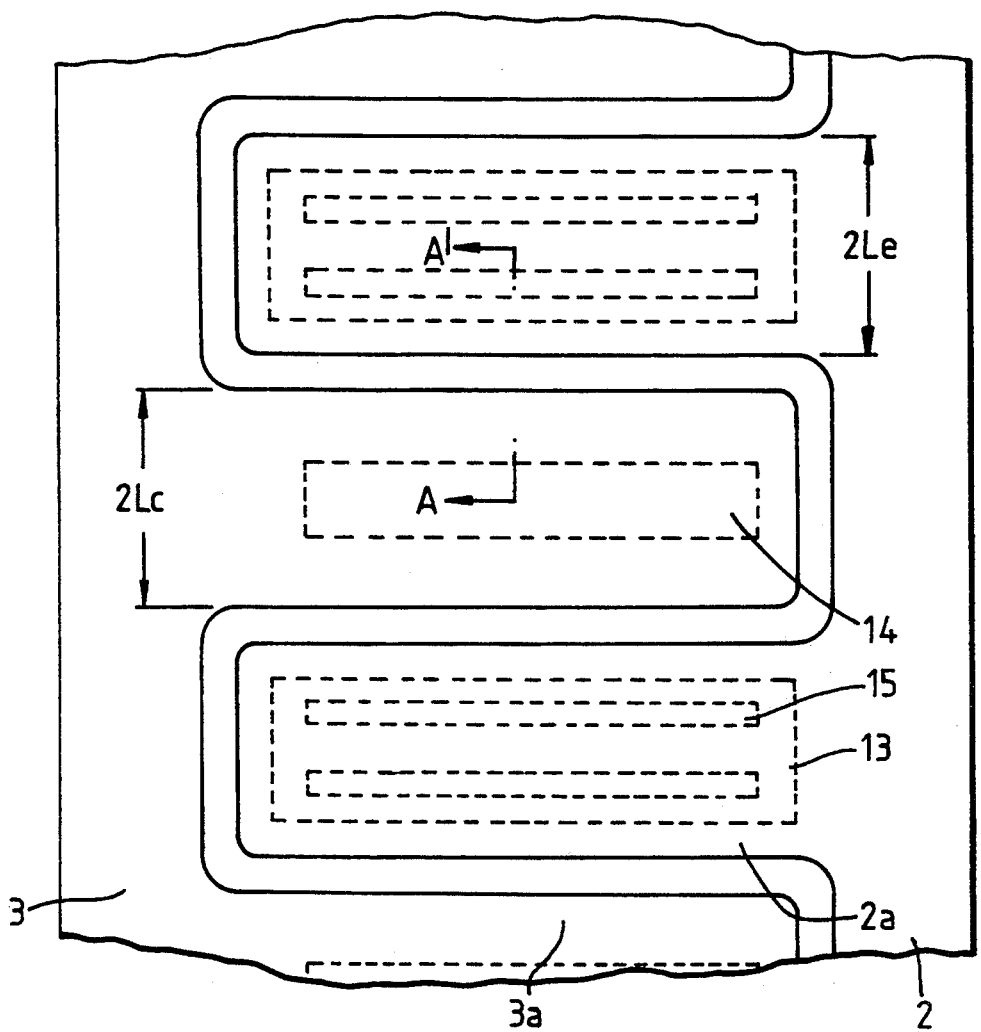
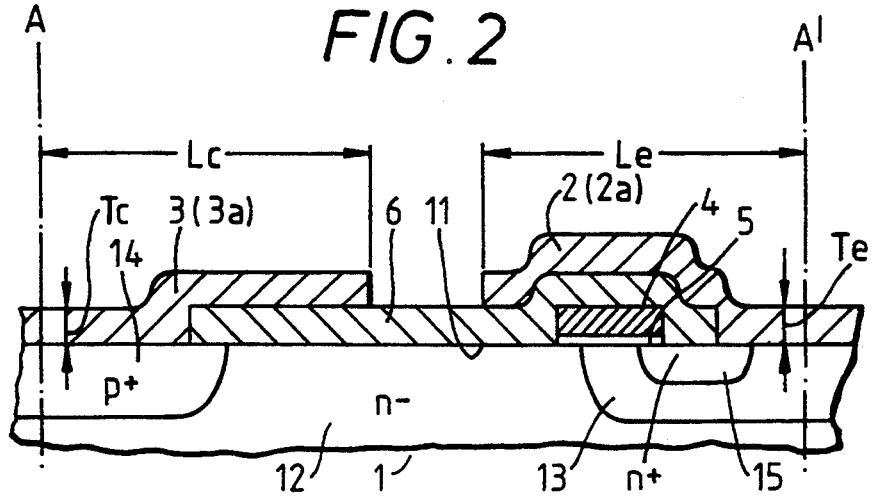

LATERAL INSULATED GATE BIPOLAR TRANSISTOR

BACKGROUND OF THE INVENTION

1. Field of the Invention

The present invention relates to a lateral insulated gate bipolar transistor.

2. Summary of the Prior Art

An insulated gate bipolar transistor (hereinafter referred to as an IGBT) has, for example, a semiconductor substrate serving as a drift region, which substrate is of a first conductivity type (e.g. is of n-type). A base region of different conductivity type (e.g. p-type) is formed in one surface of the substrate, and an emitter region of the same conductivity type as the substrate is formed within the base region. A collector region may then be formed in the opposite surface of the substrate, which collector region is of the same conductivity type as the base region. Emitter electrodes are provided on the emitter region, which emitter electrodes also contact the base region. A collector electrode is provided on the collector region. A gate electrode structure, formed by a gate electrode and an insulating film, is provided which contacts the base region, the emitter region and the drift region.

When a positive potential is applied to the gate electrode of such an IGBT, the surface of the base region under the insulating film is inverted to n-type conductivity, thereby forming a channel. In this case, when the collector electrode has a higher potential than the emitter electrode, electrons move from the emitter region to the collector region through the channel and drift regions. The electrons that reach the collector region promote the injection of holes from the collector region. This decreases the resistance of the drift region, due to conductivity modulation. Thus, the structure is similar to a MOSFET in which the collector region is changed into a drain region. However, the resistance of the IGBT in the on state is lower than that of the equivalent MOSFET.

When fabricating such a device, it is inconvenient for the collector region to be formed on the opposite surface of the substrate from the other regions, and therefore it has been proposed to form a IGBT with a lateral structure, in which the base, emitter and collector regions are in the same surface of the substrate, so that the electrodes may also be on a common surface of that substrate. An example of such a lateral insulating gate bipolar transistor is shown in U.S. Pat. No. 4,933,740.

In U.S. Pat. No. 4,933,740, a plurality of such lateral insulated-gate bipolar transistors are formed together in an array, with adjacent transistors being mirror images of each other. Thus, for a given transistor, the adjacent transistor on one side has its emitter region in common with the given transistor, while the adjacent transistor on the other side has its collector region in common with the given transistor. The emitter and collector electrodes of the transistors of the array may then be integral, so that they are electrically connected. Furthermore, the emitter and collector electrodes of each transistor are elongate.

SUMMARY OF THE INVENTION

There is a limit to the current which can flow through an IGBT. It is desirable to provide a plurality of IGBTs in an array, and to make the area of the array occupied by each IGBT as small as possible, so as to increase the current-carrying capacity of the array per unit area. However, it has been found, by the inventors of the present application, that problems may then arise. For example when a sufficiently large current flows between the collector electrode and the emitter electrode of a lateral IGBT, the hole current and the lateral resistance under the emitter region result in a large voltage drop. This causes the pn junction between the emitter region and the base region to be forwardly biased. As a result, electrons are injected from the emitter region into the base region, and the effect is that a parasitic thyristor is formed by the emitter region, base region, drift region and collector region. When electrons are injected from the emitter region into the base region, this parasitic thyristor is turned on, and the current is then not controlled by the gate electrode. This effect is termed "latch-up".

The problem of latch-up has been found by the present inventors to be particularly acute in the type of lateral insulated-gate bipolar transistor array disclosed in U.S. Pat. No. 4,933,740. In that array, the structures formed by the integral emitter and collector electrodes of the transistors can each be considered to form a "comb", with the teeth of that comb being the emitter or collector electrodes, and those teeth being linked to form emitter and collector electrode structures. The combs formed by the emitter and collector electrodes are positioned so that the teeth of one comb extend into the spaces between the teeth of the other comb.

In the structure disclosed in U.S. Pat. No. 4,933,740, the teeth of the comb formed by the collector electrodes have a width, in a direction perpendicular to the direction of elongation of the electrodes, which is significantly smaller than the width of the teeth of the emitter electrodes. Since the two electrodes have approximately the same thickness, the resistance per unit length of the teeth of the collector electrodes in their direction of elongation is significantly greater than the resistance per unit length of the emitter electrodes. Therefore, the resistance of the current path from the root of a tooth of the collector electrode to the end of a tooth of the emitter electrode, and along that emitter electrode, is greater than the resistance along the collector electrode to the end thereof, and from that end to the root of the tooth of the emitter electrode. Therefore, the current density at the ends of the teeth of the emitter electrodes is higher than other regions, and this increases the risk of latch-up occurring at that part of the device.

The discovery of this effect led to the making of the present invention.

In its most general aspect, the present invention proposes that the elongate emitter and collector electrodes are such that there is no significant current density localization along their length. Some variation of the current between emitter and collector along the length of the electrodes is possible, but the present invention proposes that the variation should not be greater than 50%.

In order to control the current, an aspect of the present invention proposes that the resistance per unit length of the emitter and collector electrodes is such that the ratio thereof is in the range 0.5 to 2.0, preferably 0.8 to 1.2.

Since the resistance per unit length of an electrode, whether emitter or collector, is generally proportional to its area, it is possible to provide emitter and collector electrodes of approximately the same thickness, and select the widths thereof such that the distances are in the desired range. Such an arrangement reduces the risk of latch-up, but has the disadvantage that the width of the collector electrodes are increased, relative to the structure shown in U.S. Pat. No. 4,933,740, and therefore the density of transistor units in an array is decreased.

Therefore, an alternative is to provide collector and emitter electrodes of different widths, as in U.S. Pat. No. 4,933,740, but to select the thicknesses thereof such that the ratio of the cross-sectional areas is in the desired range. Hence, since the necessary width of the collector electrode is less than the emitter electrode, the collector electrode will have a greater thickness. It may be, however, that this need for different thicknesses leads to manufacturing difficulties.

Therefore, a further possibility is for either or both of the emitter and collector electrodes to have an auxiliary part, the shape of which is determined such that the ratio of the total resistances per unit length of the electrodes (including the auxiliary parts) is within the desired limit. In order to achieve this, the main and auxiliary parts of either or both of the collector and emitter electrodes may be different. Since it is the collector electrode which is normally smaller than the emitter electrode, it will normally be necessary to provide the emitter electrode with an auxiliary part which is smaller than the main part.

It is also preferable for at least the collector electrode to extend over the drift region, and to be separated therefrom by an insulating layer. This gives a "field plate" effect.

The present invention relates to a lateral insulated-gate bipolar transistor, but it is possible to embody the invention in an array of such transistors, e.g. in U.S. Pat. No. 4,933,740.

In a lateral insulated-gate bipolar transistor, the drift layer is of different conductivity type than the base and collector layers. In this specification, the term conductivity type refers to the type of dopant of the semiconductor material, and therefore regions may be of the same conductivity type although the concentration of dopant thereof is different. Thus, for example, the base and collector may have different dopant concentrations. Furthermore, there may be variations in dopant concentration within one or more of the regions of the transistor.

BRIEF DESCRIPTION OF THE DRAWINGS

Embodiments of the present invention will now be described in detail, by way of example, with reference to the accompanying drawings, in which:

FIG. 1 is a plan view of a lateral insulated-gate bipolar transistor array according to a first embodiment of the present invention;

FIG. 2 is a sectional view along the line A—A' in FIG. 1;

DETAILED DESCRIPTION

Figure 3:
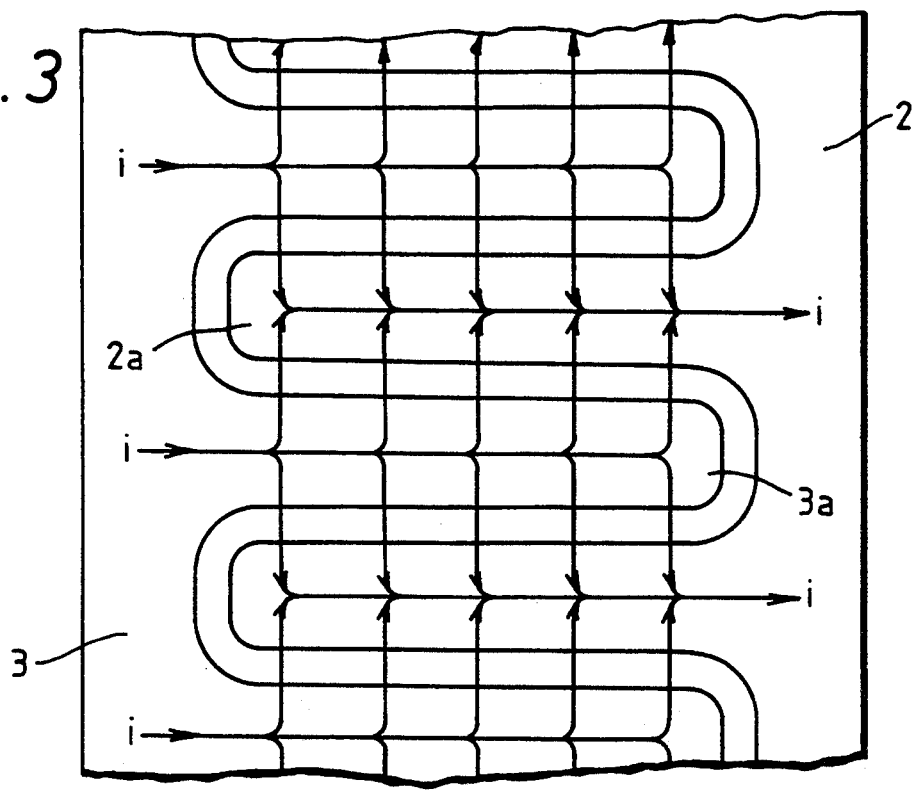
FIG. 3 is a schematic plan view illustrating the flow of current in the transistor array of FIG. 1.

FIGS. 1 and 2 are a plan view and a vertical sectional view illustrating a first embodiment of a lateral insulated-gate bipolar transistor array according to the present invention.

In FIGS. 1 and 2 a semiconductor substrate defines a drift region 12 of n-type electric conductivity neighboring a main surface 11. A base layer 13 and a collector layer 14 extend into the drift region 12 from the main surface 11. The base layer 13 and the collector layer 14 are separated from each other, and each have an impurity concentration higher than that of the drift region 12. An emitter layer 15 of n-type electric conductivity extends into the base layer 13 from the main surface 11 and has an impurity concentration higher than that of the base layer 13. The base layer 13 and the collector layer 14 are stripe-shaped, so that they are elongate in a direction referred to subsequently as "the direction of elongation", and are arranged such that they alternate in a direction at right angles with their direction of elongation. The emitter layers 15 are stripe-shaped, and two such emitter layers 15 are arranged in each base layer in such a manner that the direction of elongation thereof is the same as the direction of elongation of the base layer 13.

A comb-shaped emitter electrode structure 2, having teeth 2a that are in contact with the emitter layers 15 is formed along the base region 13 and with the base region 13 on the main surface 11. A comb-shaped collector electrode structure 3 having teeth 3a that are in contact with the collector layer 14, is formed along the collector layer 14 on the main surface 11. A gate electrode 4 is formed on the main surface 11. This gate electrode 4 extends over the base layer 13, over the drift region 12 on both sides of the base layer 13, and over the emitter layers 15. A gate insulating film 5 is provided between the gate electrode 4 and the main surface. A first insulating film 6 is formed on the drift region 12, on the portions of the emitter layer 15 where there is no emitter electrode structure 2, on the parts of the collector layer 14 where there is no collector electrode structure 3, and on the gate electrode 4. The teeth 2a of the emitter electrode structure 2 and the teeth of the collector electrode structure 3 extend on the first insulating film 6 and reach the drift region 12. As a result, teeth 2a and teeth 3a alternate along the device in a direction perpendicular to the direction of their elongation, as shown in FIG. 1. Furthermore, the teeth 2a of the emitter electrode structure 2 and the teeth 3a of the collector electrode structure 3 are made of the same material having approximately the same thickness (Te=Tc) and having nearly the same width (width in a direction at right angles to the direction of elongation, 2Le=2Lc). Thus, the array is formed by a plurality of transistor units side-by-side. The line A to A' in FIG. 1, and the sectional view of FIG. 2 illustrates one such unit. The unit comprises a first semiconductor region formed by part of the drift region 12, a second semiconductor region formed by half (in a direction perpendicular to the direction of elongation thereof) of the base layer 13, a third semiconductor region formed by half (in a direction perpendicular to the direction of elongation thereof) of the collector layer 14, and one of the emitter layers 15. Hence, the width of the collector electrode for one transistor unit is $L_c$ and the width of the emitter electrode is $L_e$ (see FIG. 2).

With the structure described for the above constitution, the wiring resistance Rc of the toothed portions 3a of the collector electrode structure 3 per unit length in the direction of elongation is approximately equal to the wiring resistance Re of the teeth 2a of the emitter electrode structure 2 per unit length in the direction of elongation. Hence, when the device is turned on, current flows at a substantially uniform density from the teeth 3a of the collector electrode structure 3 to the teeth 2a of the emitter electrode structure 2. Therefore, the current density does not have a locally high region.

As shown in FIG. 3, therefore, the current density along the side of the collector layer 14 becomes approximately equal to the current density along the side of the emitter layer 13, contributing to improved performance and helping to prevent latch-up.

Figure 4:
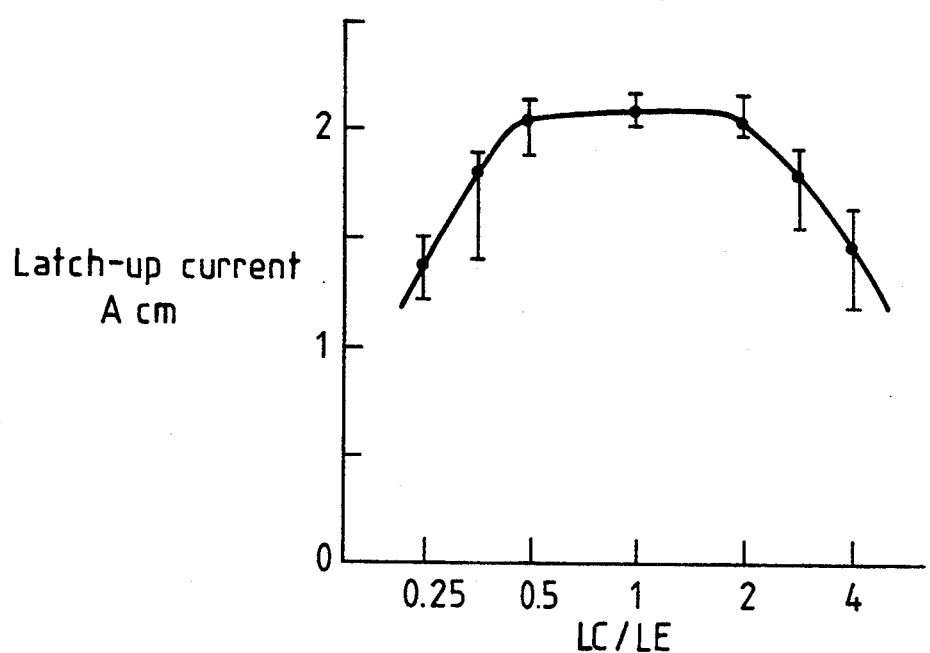
FIG. 4 is a graph showing the relationship between latch-up current and ratio of the width of collector electrode to emitter electrode in the embodiment of FIGS. 1 to 3.

FIG. 4 shows the result of latched-up currents (reckoned as current per unit length of the electrode) examined by the present inventors by using IGBTs having various widths 2Le of emitter electrode structure 2, various widths 2Lc of collector electrode structure and various lengths of electrodes. It was discovered that the effect of preventing latch-up is exhibited most conspicuously when Lc/Le lies between 0.5 and 2.0. A range of 0.8 to 1.2 is preferred.

Furthermore, an improved breakdown voltage is obtained since the emitter electrode structure 2 and the collector electrode structure 3 extend onto the drift region 12 via the first insulation film 6 in a field plate structure.

Also, the teeth 2a of the emitter electrode structure 2 and the teeth 3a of the collector electrode structure 3 are made of the same material, and have nearly the same thickness (Te=Tc) and nearly the same width (2Le=2Lc in a direction at right angles with the direction of elongation). Therefore, these electrodes can be formed by a simplified step, and the wiring resistances can be set to be approximately equal to each other per unit length.

It is desirable for the variation of current density between the emitter and collector and layers 13, 14, in the direction of elongation to be as small as possible, preferably zero. Since this depends on the accuracy of manufacture, and in particular on the accuracy of the thicknesses Tc, Te and widths Lc, Le of each transistor, there may be some variation in the current density. However, such variation should be less than 50%.

Figure 5:
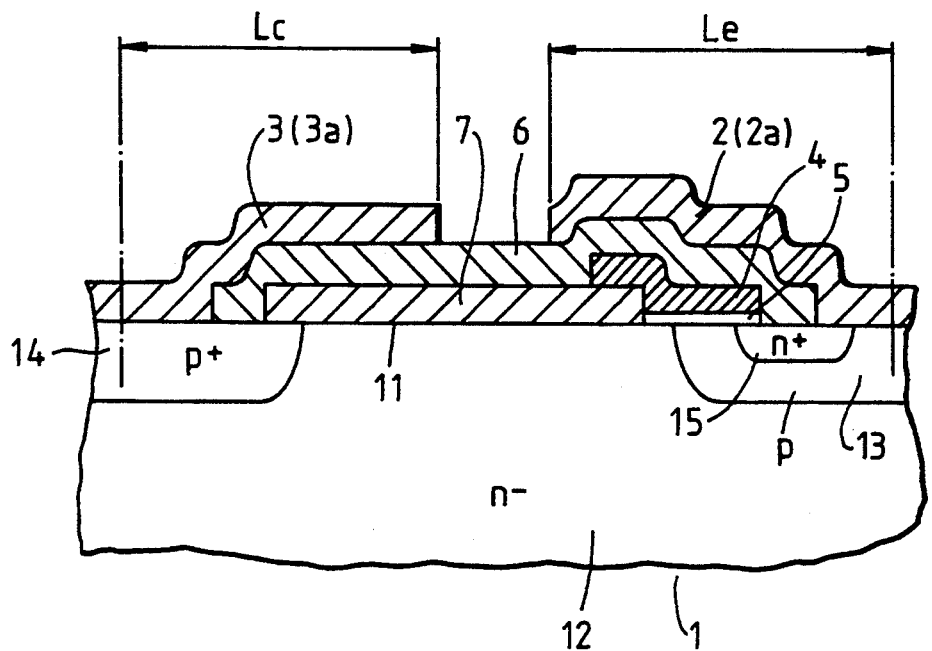
FIG. 5 is a sectional view of a lateral insulated-gate bipolar transistor, being a second embodiment of the present invention.

FIG. 5 is a vertical sectional view illustrating a lateral insulated-gate bipolar transistor of a second embodiment of the present invention. In FIG. 1, the teeth 3a of the collector electrode structure 3 extend over a significant part of the drift region 12, with the first insulation film 6 therebetween, so that the width of the teeth 3a of the collector electrode structure 3 is approximately equal to the width of the teeth 2a of the emitter electrode structure 2. Therefore, there is degradation in the field plate effect, which may lead to a problem with the breakdown voltage. It is possible to increase the width of the collector layer 14 in order to increase the width of the teeth 3a of the collector electrode 3. In this case, however, the size of a unit IGBT indicated by A—A' increases, leading to problems when reduction in the degree of integration of unit IGBTS is sought. The embodiment of FIG. 5 seeks to solve these inconveniences and problems, and has a second insulating film 7, thicker than the gate insulating film 5, between the drift region 12 and parts of the first insulating film 6 and the collector region 14, and a part of the gate electrode 4 extends onto the second insulating film 7. With this construction, the electric field is decreased in a stepwise manner by the gate electrode 4 and the emitter electrode structure 2, and an IGBT having a high breakdown voltage may be achieved having the same size as that of FIG. 1.

As a matter of course, the width 2Le of the teeth 2a of the emitter electrode structure 2 is set to be approximately equal to the width 2Lc of the teeth 3a of the collector electrode structure 3 in the same manner as in FIGS. 1 and 2, improving the preventing of latch-up.

Figure 6:
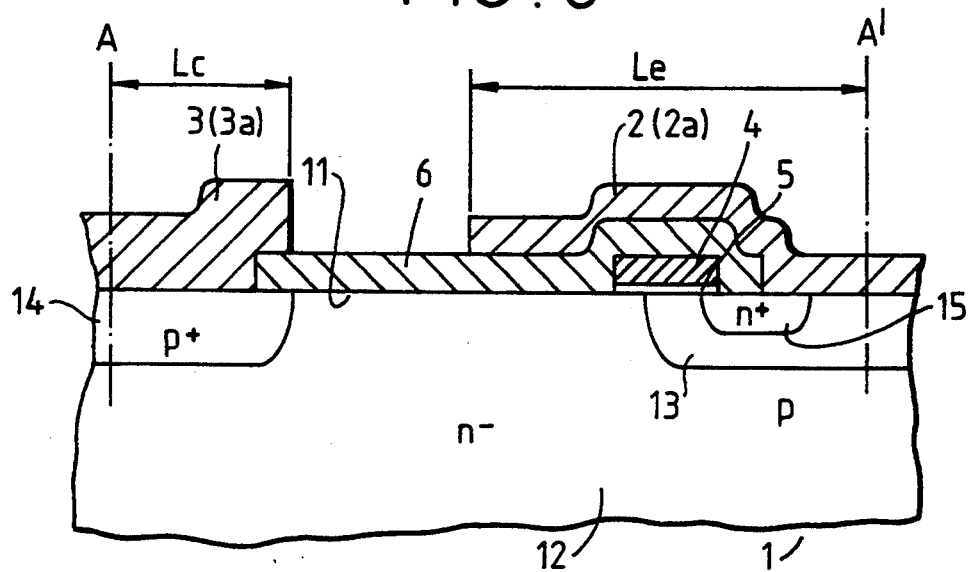
FIG. 6 is a sectional view of a lateral insulated-gate bipolar transistor, being a third embodiment of the present invention.

FIG. 6 is a vertical sectional view illustrating a lateral insulated-gate bipolar transistor of a third embodiment of the present invention. This embodiment also seeks to solve the problems associated with the embodiment of FIG. 1 in which the breakdown voltage and the degree of integration are reduced, as described previously. This embodiment differs from that of FIGS. 1 and 2 in that the teeth 3a of the collector electrode structure 3 have a thickness greater than that of, and have a width smaller than that of, the teeth 2a of the emitter electrode structure 2. The sectional areas of the teeth of the two electrodes in a direction at right angles with the direction of elongation thereof are approximately equal, in accordance with the principles of the present invention. With this structure, although the width 2Lc of the teeth 3a of the collector electrode structure 3 is small, the sectional area of the teeth 2a of the emitter electrode structure 2 can be set to be substantially equal to the sectional area of the teeth 3a of the collector electrode structure 3 by increasing the thickness of the collector electrode structure 3, and the resistances of the teeth per unit length can be set to be equal to each other, making it possible to reduce the risk of latch-up and to permit a high breakdown voltage and a high degree of integration to be achieved.

Figure 7:
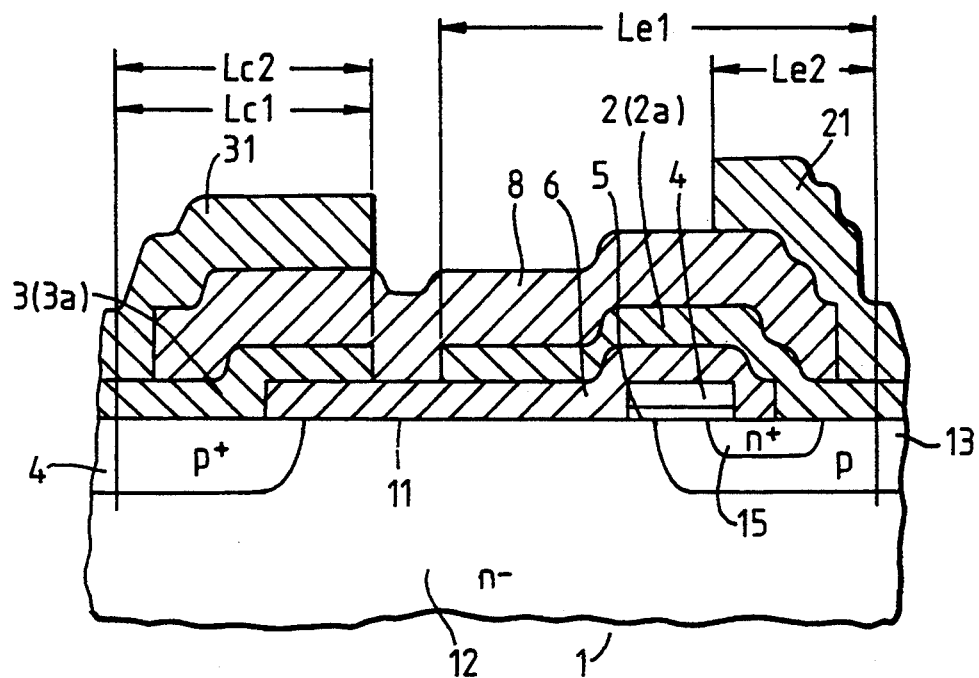
FIG. 7 is a sectional view of a lateral insulated-gate bipolar transistor, being a fourth embodiment of the present invention.

FIG. 7 is a vertical sectional view illustrating a lateral insulated-gate bipolar transistor of a fourth embodiment of the present invention which uses two-layer wiring technology. This embodiment differs from that of FIGS. 1 and 2 in that a third insulating film 8 is formed on the emitter electrode structure 2, on the collector electrode structure 3 and on the first insulating film 6 that is exposed between the above two electrodes. Also, the emitter electrode has an auxiliary part 21, and the collector electrode has an auxiliary part 31. These auxiliary parts 21, 31 are in electrical contact with at least the teeth 2a of the emitter electrode structure 2 and the teeth 3a of the collector electrode structure 3 and extend onto the third insulating film 8. Thus, this embodiment differs from that of FIGS. 1 and 2 with respect to that the teeth 2a of the emitter electrode structure 2 extending on the first insulating film 6 have an increased size, and the teeth 3a of the collector electrode structure 3 extending on the first insulating film 6 have a decreased size.

The auxiliary part 21 of the emitter electrode and the auxiliary part 1 of the collector electrode are made of the same material and have substantially the same thickness. Therefore, the auxiliary electrodes can be formed easily without an excessive number of processing steps. Moreover, the width 2Lc2 of the auxiliary part 31 of the collector electrode is approximately the same as the width 2Lc1 of the teeth 3a of the main part of the collector electrode, and the width 2Le2 of the auxiliary part 21 of the emitter electrode is smaller than the width 2Le1 of the teeth 2a of the main part of the emitter electrode. Therefore, the sum of the sectional areas of the teeth 2a of the main part of the emitter electrode and of the auxiliary part 21 of the emitter electrode in a direction at right angles to the direction of elongation thereof is approximately equal to the sum of the sectional areas of the teeth 3a of the main part of the collector electrode and of the auxiliary part 31 of the collector electrode in a direction at right angles to the direction of elongation thereof. Thus, the relative width of teeth 2a of the emitter electrode structure 2 is increased, and the relative width of teeth 3a of the collector electrode structure 3 is decreased. In other words, the configuration of this embodiment makes it possible to produce a lateral insulated-gate bipolar transistor that can be easily fabricated, in addition to reducing the risk of latch-up and improving the breakdown voltage and the degree of integration.

With this embodiment, furthermore, the widths 2Le2 and 2Lc2 of the auxiliary part 21 of the emitter electrode and the auxiliary part 31 of the collector electrode are controlled so that the wiring resistance of the teeth 3a of the collector electrode becomes approximately equal to the wiring resistance of the teeth 2a of the emitter electrode without the need to take the field plate effect into consideration. Therefore, the aims of the present invention can be easily accomplished relying upon the ordinary two-layer wiring technology.

Figure 8:
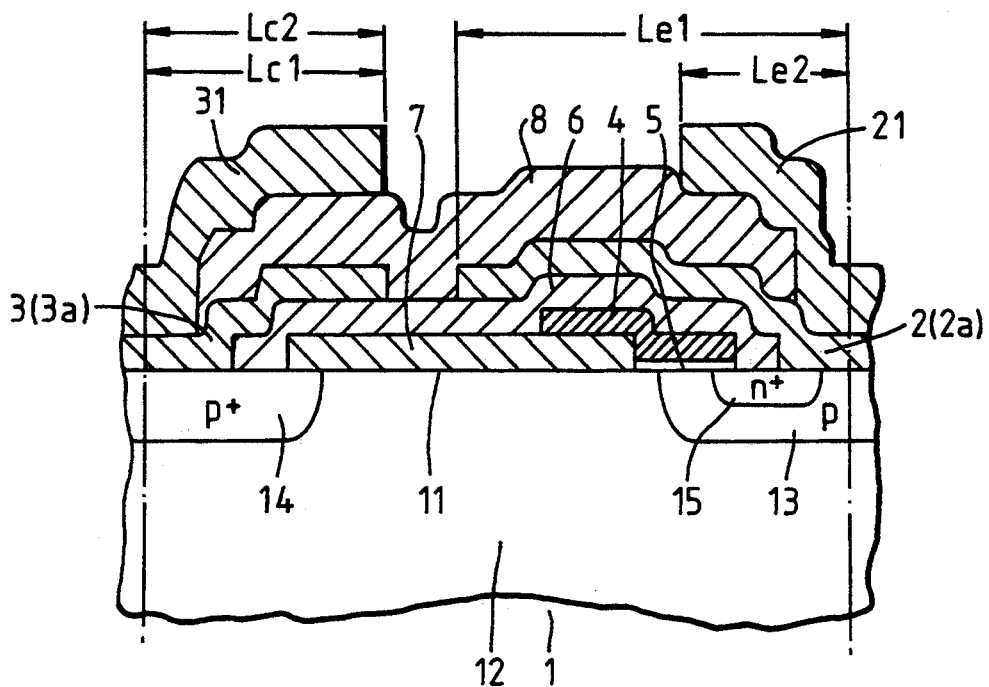
FIG. 8 is a sectional view showing a lateral insulated-gate transistor, being a fifth embodiment of the present invention.

FIG. 8 is a vertical sectional view of a lateral insulated-gate bipolar transistor using two-layer wiring technology, being a fifth embodiment of the present invention. The embodiment of FIG. 8 has a similar construction to that of FIG. 5, but has added thereto the auxiliary part 21 of the emitter electrode and the auxiliary part 31 of the collector electrode that are shown in FIG. 7. This construction enables the electric field to be reduced to a greater extent than in the embodiment of FIG. 7 and, hence a further increase in breakdown voltage can be obtained.

Figure 9:
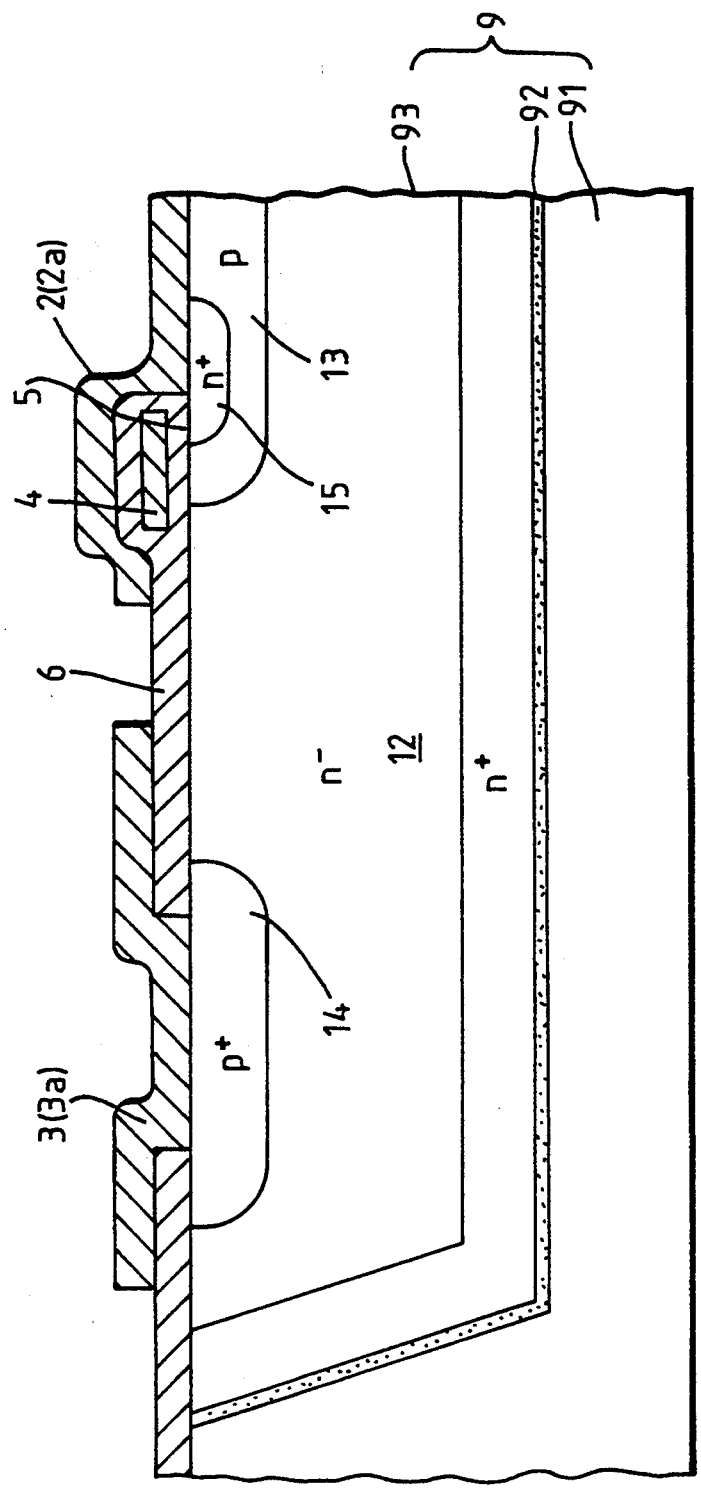
FIG. 9 is a sectional view of a lateral insulated-gate bipolar transistor, being a sixth embodiment of the present invention.

FIG. 9 is a vertical sectional view illustrating a sixth embodiment, in which a lateral insulated-gate bipolar transistor according to the present invention is formed in a dielectric-isolated substrate 9. The dielectric-isolated substrate 9 comprises a support member 91 composed of, for example, polysilicon, and a single crystal island 93 supported thereon via a silicon oxide film 92. The lateral insulated-gate bipolar transistor is formed in the single crystal island 93. In FIG. 9, the lateral insulated-gate bipolar transistor has the same structure as the embodiment of FIG. 1, and the parts corresponding to those of FIG. 1 are denoted by the same reference numerals. This construction is adopted to integrate IGBTs having a breakdown voltage higher than 200 V. However, similar constructions are possible making use of a dielectric isolated substrate, but in which the lateral insulated gate bipolar transistor has a construction corresponding to any one of FIGS. 4 to 8. It is possible to use a single silicon crystal or an inorganic oxide instead of the support member 91, and to use other inorganic oxide, organic or inorganic adhesive agent instead of the silicon oxide film 92. Further, when the IGBTs having a low breakdown voltage are to be fabricated in an integrated form, there can be used a pn-isolated substrate instead of the dielectric-isolated substrate.

Figure 10:
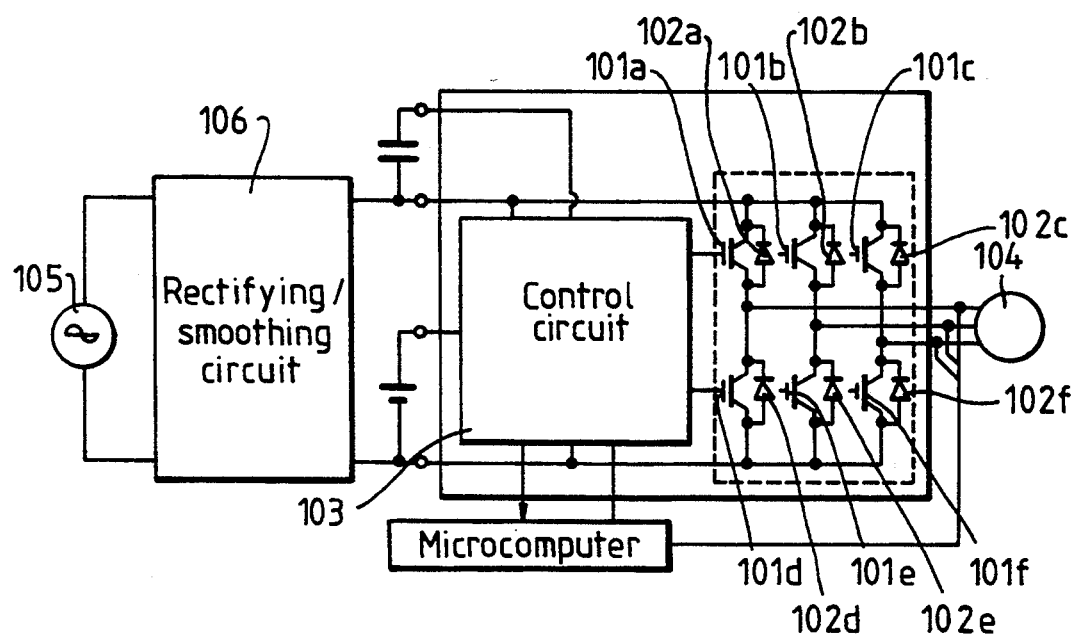
FIG. 10 is a schematic block diagram of a three-phase inverter IC in which lateral insulated-gate bipolar transistors according to the present invention may be used.
Figure 11:
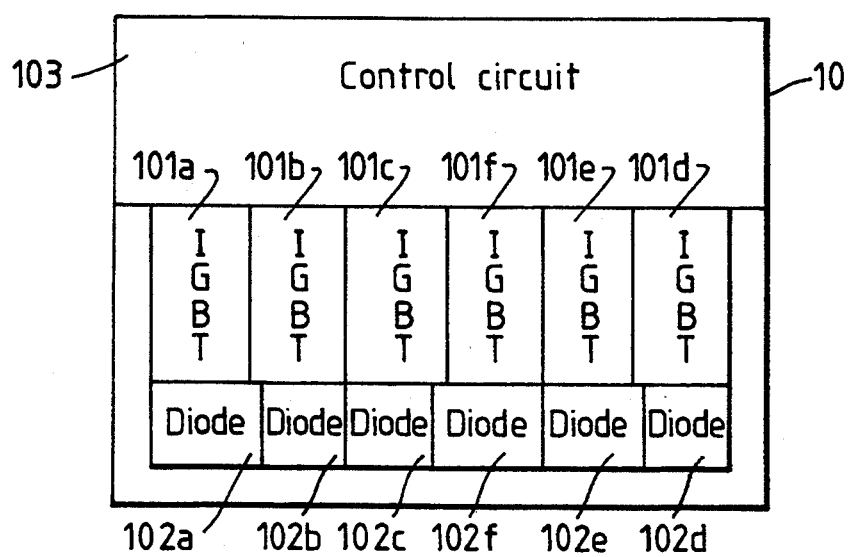
FIG. 11 illustrates the layout of a semiconductor chip which components of the inverter of FIG. 10 are integrated.

FIGS. 10 and 11 are respectively a block diagram of a high-breakdown-voltage three-phase inverter integrated circuit using a lateral insulated-gate bipolar transistors of the present invention and a diagram of a chip layout. One IC substrate (dielectric-isolated substrate) 10 has integrated therein six IGBTs 101a, 101b, 101c, 101d, 101e, 101f, six diodes 102a, 102b, 102c, 102d, 102e, 102f, and a control circuit 103. This structure provides a drive circuit for inverter-controlling a motor 104 by using the above single IC connected to a commercial power source 105 of e.g. 100 volts via a rectifying/-smoothing circuit 106. In this case, a DC voltage of about 140 volts rectified from the commercial power source 105 is applied to the IGBTs. For this purpose, the IGBT must have a breakdown voltage of about 250 V. The operation of the inverter integrated circuit is controlled by a microcomputer 107.

Moreover, for a motor 104 of, for example, 50 W, a current of about 1 A must be output from each of the IGBTs. A lateral insulated-gate bipolar transistor according to the present invention is capable of controlling a large current without latch-up occurring. The structure makes it easy to maintain a suitable breakdown voltage. Therefore, the lateral IGBT of the present invention is suitable to be fabricated in an integrated form, and is also suitable for forming a high-breakdown-voltage three-phase inverter IC.

The present invention was described above by way of representative embodiments but it should be noted that the invention is not limited thereto.

The present invention makes it possible to obtain a lateral insulated-gate bipolar transistor which has improved latch-up prevention and is capable of controlling large currents without impairing the breakdown voltage and the degree of integration.

What is claimed is:
1. A lateral insulated-gate bipolar transistor, comprising:
  a first semiconductor region of a first conductivity type having a main surface;
  second and third semiconductor regions each of a second conductivity type, each extending into said first semiconductor region from said main surface, said second and third semiconductor regions being elongate in a predetermined direction and being spaced apart transverse to said predetermined direction,
  a fourth semiconductor region extending into said second semiconductor region from said main surface;
  an insulated-gate structure on said main surface and extending over said first, second and fourth semiconductor regions;
  a first main electrode electrically connected to said second and fourth semiconductor regions, said first main electrode being elongate in said predetermined direction; and a second main electrode electrically connected to said third semiconductor region, said second main electrode being elongate in said predetermined direction;

wherein the ratio of resistances per unit length in the predetermined direction of the first and second main electrodes is in a range of 0.5 to 2.0, and wherein at least one of said first and second main electrodes comprises a multi-layer wiring structure having a main part and an auxiliary part, the main and auxiliary parts being electrically connected to one another and at least partially being separated from one another by an insulating layer.

2. A transistor according to claim 1, wherein the widths, in a direction parallel to said main surface and perpendicular to said predetermined direction, of said main and auxiliary parts of said first main electrode are different from one another.

3. A transistor according to claim 2, wherein the widths, in a direction parallel to said main surface and perpendicular to said predetermined direction, of the main and auxiliary parts of said second main electrode are substantially equal to one another.

4. A transistor according to claim 1 or claim 2, wherein said first main electrode extends at least partially over said insulated-gate structure, and is separated therefrom by an insulating layer.

5. A transistor according to claim 1 or claim 2, wherein said insulated-gate structure includes a gate insulated layer on said main surface contacting said first, second and fourth regions, and a control electrode on said gate insulating layer.

6. A transistor according to claim 5, comprising further insulating layer on said main surface adjacent said gate insulating layer, and wherein a part of said control electrode and a part of said second main electrode extend over said further insulating layer.

7. A transistor according to claim 1, wherein the ratio of resistances per unit length in the predetermined direction of the first and second main electrodes is in a range of 0.8 to 1.2.

8. A lateral insulated-gate bipolar transistor, comprising:

a first semiconductor region of a first conductivity type having a main surface;

second and third semiconductor regions each of a second conductivity type, each extending into said first semiconductor region from said main surface, and second and third semiconductor regions being elongate in a predetermined direction and being spaced apart transverse to said predetermined direction, a fourth semiconductor region extending into said second semiconductor region from said main surface;

an insulated-gate structure on said main surface and extending over said first, second and fourth semiconductor regions;

a first main electrode electrically connected to said second and fourth semiconductor regions, said first main electrode being elongate in said predetermined direction; and a second main electrode electrically connected to said third semiconductor region, said second main electrode being elongate in said predetermined direction, wherein the first and second main electrodes have different widths from one another in a predetermined direction, wherein the ratio of the widths in the predetermined direction of the first and second main electrodes is in a range of 0.5 to 2.0, and wherein each of said first and second main electrodes comprises a multi-layer wiring structure having a main part and an auxiliary part, the main and auxiliary parts of the first main electrode being electrically connected to one another and at least partially being separated from one another by an insulating layer, and the main and auxiliary parts of the second main electrode being electrically connected to one another and at least partially being separated from one another by an insulating layer.

9. A transistor according to claim 8, wherein the widths, in a direction parallel to said main surface and perpendicular to said predetermined direction, of said main and auxiliary parts of said first main electrode are different from one another.

10. A transistor according to claim 9, wherein the widths, in a direction parallel to said main direction and perpendicular to said predetermined direction, of the main and auxiliary parts of said second main electrode are substantially equal to one another.

11. A transistor according to claim 8 or claim 9, wherein said first main electrode extends at least partially over said insulated-gate structure and is separated therefrom by an insulating layer.

12. A transistor according to claim 1 or 9, wherein said insulated-gate structure includes a gate insulating layer on said main surface contacting said first, second and fourth regions, and a control electrode on said gate insulating layer.

13. A transistor according to claim 12, comprising a further insulating layer on said main surface adjacent said gate insulating layer, and wherein a part of said control electrode and a part of said second main electrode extend over said further insulating layer.

14. A transistor according to claim 8, wherein the ratio of widths in the predetermined direction of the first and second main electrodes is in a range of 0.8 to 1.2.

* * * * *